(12) United States Patent
Guan

(10) Patent No.: US 7,948,755 B1
(45) Date of Patent: May 24, 2011

(54) COOLING SYSTEM AND ELECTRONIC DEVICE USING THE SAME

(75) Inventor: Zhi-Bin Guan, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 0 days.

(21) Appl. No.: 12/639,867

(22) Filed: Dec. 16, 2009

(30) Foreign Application Priority Data

Nov. 26, 2009 (TW) .................................. 98140309

(51) Int. Cl.
*H05K 7/20* (2006.01)
(52) U.S. Cl. ............... 361/695; 361/679.48; 361/679.49; 361/692; 165/104.34; 165/121; 165/122; 181/224; 181/225; 181/286; 415/213.1; 415/214.1; 416/244 R
(58) Field of Classification Search .......... 361/679.46, 361/679.48, 679.49, 690–697, 725, 726; 165/80.2, 80.3, 104.33, 104.34, 121–126, 165/185; 415/200, 203, 206, 213.1, 214.1, 415/216.1, 178; 181/201, 224–226, 286, 181/287, 290, 295; 416/146 R, 244 R, 69, 416/70 R; 454/184
See application file for complete search history.

(56) References Cited

U.S. PATENT DOCUMENTS

| | | | | |
|---|---|---|---|---|
| 6,556,437 B1 * | 4/2003 | Hardin | ..................... | 361/679.48 |
| 6,690,576 B2 * | 2/2004 | Clements et al. | ............. | 361/695 |
| 6,839,233 B2 * | 1/2005 | Cravens et al. | ............... | 361/695 |
| 7,379,300 B1 * | 5/2008 | Chen | .............. | 361/695 |
| 7,445,430 B2 * | 11/2008 | Kao et al. | ................... | 415/213.1 |
| 7,511,955 B2 * | 3/2009 | Yin | ................. | 361/695 |
| 7,535,709 B2 * | 5/2009 | Fan et al. | ...................... | 361/695 |
| 7,537,480 B2 * | 5/2009 | Li | ................. | 439/485 |
| 7,586,746 B2 * | 9/2009 | Liu | ................. | 361/695 |
| 7,639,496 B2 * | 12/2009 | Lv et al. | ......................... | 361/695 |
| 7,688,585 B2 * | 3/2010 | Yin | ................. | 361/695 |
| 7,697,286 B2 * | 4/2010 | Hung | ........................... | 361/694 |
| 7,697,287 B2 * | 4/2010 | Yin | ................. | 361/695 |
| 7,701,713 B2 * | 4/2010 | Li | ................. | 361/695 |
| 7,845,903 B2 * | 12/2010 | Li | ................. | 415/186 |
| 2008/0101019 A1 * | 5/2008 | Tao | ................. | 361/695 |
| 2009/0040717 A1 * | 2/2009 | Liu | ................. | 361/695 |

FOREIGN PATENT DOCUMENTS

CN 201184328 Y * 1/2009

\* cited by examiner

*Primary Examiner* — Michael V Datskovskiy
(74) *Attorney, Agent, or Firm* — Zhigang Ma

(57) ABSTRACT

A cooling system includes a plurality of fans and a fan bracket accommodating the fans. Each fan comprises a fan intake and a fan outlet. The fan bracket defines a plurality of air inlets and a plurality of air outlets therein. The fan bracket is provided with a fan guard in each air outlet and a plurality of noise-reducing holes in the fan guard. The air inlets of the fan bracket communicate with the fan intakes and the air outlets of the fan bracket communicate with the fan outlets, respectively. Airflow generated by the fans through the fan outlets comprises a portion exiting through the noise-reducing holes.

13 Claims, 6 Drawing Sheets

COOLING SYSTEM AND ELECTRONIC DEVICE USING THE SAME

BACKGROUND

1. Technical Field

The present disclosure relates to a cooling system and an electronic device using the cooling system.

2. Description of Related Art

In order to reduce noise, rigid specifications for sound quality have been enacted in industry. In those specifications, loudness, tonality, and modulation strength are all important measurable parameters.

In an electronic device, such as a computer, a fan is commonly employed for dissipating heat. The fan creates airflow to dissipate heat, however, aerodynamic noise is correspondingly generated, creating health hazards and impairing communications. Modulation strength is a major parameter of aerodynamic noise.

DETAILED DESCRIPTION

Figure 1:
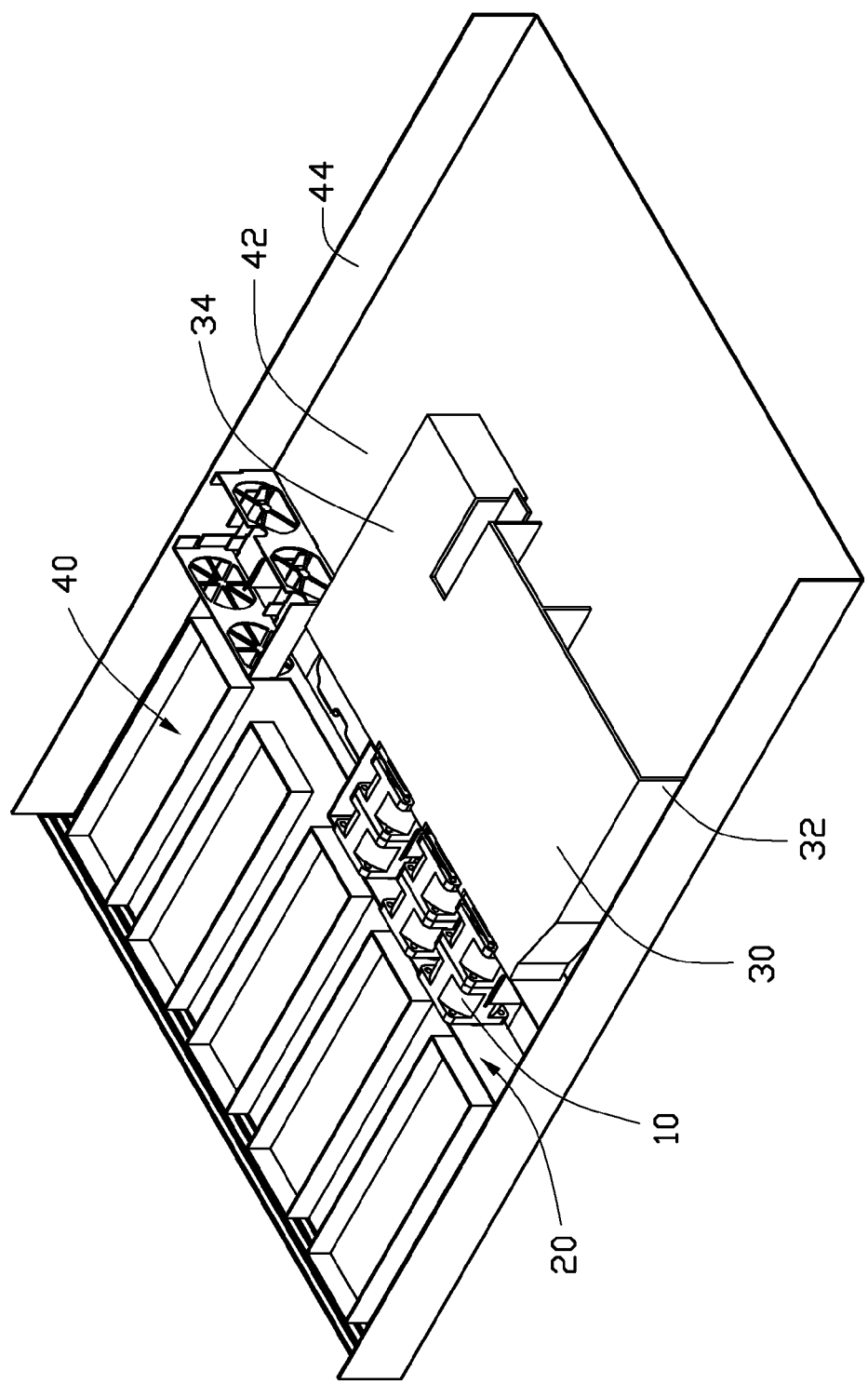
FIG. 1 is an isometric view of an electronic device in accordance with a first embodiment of the disclosure.
Figure 2:
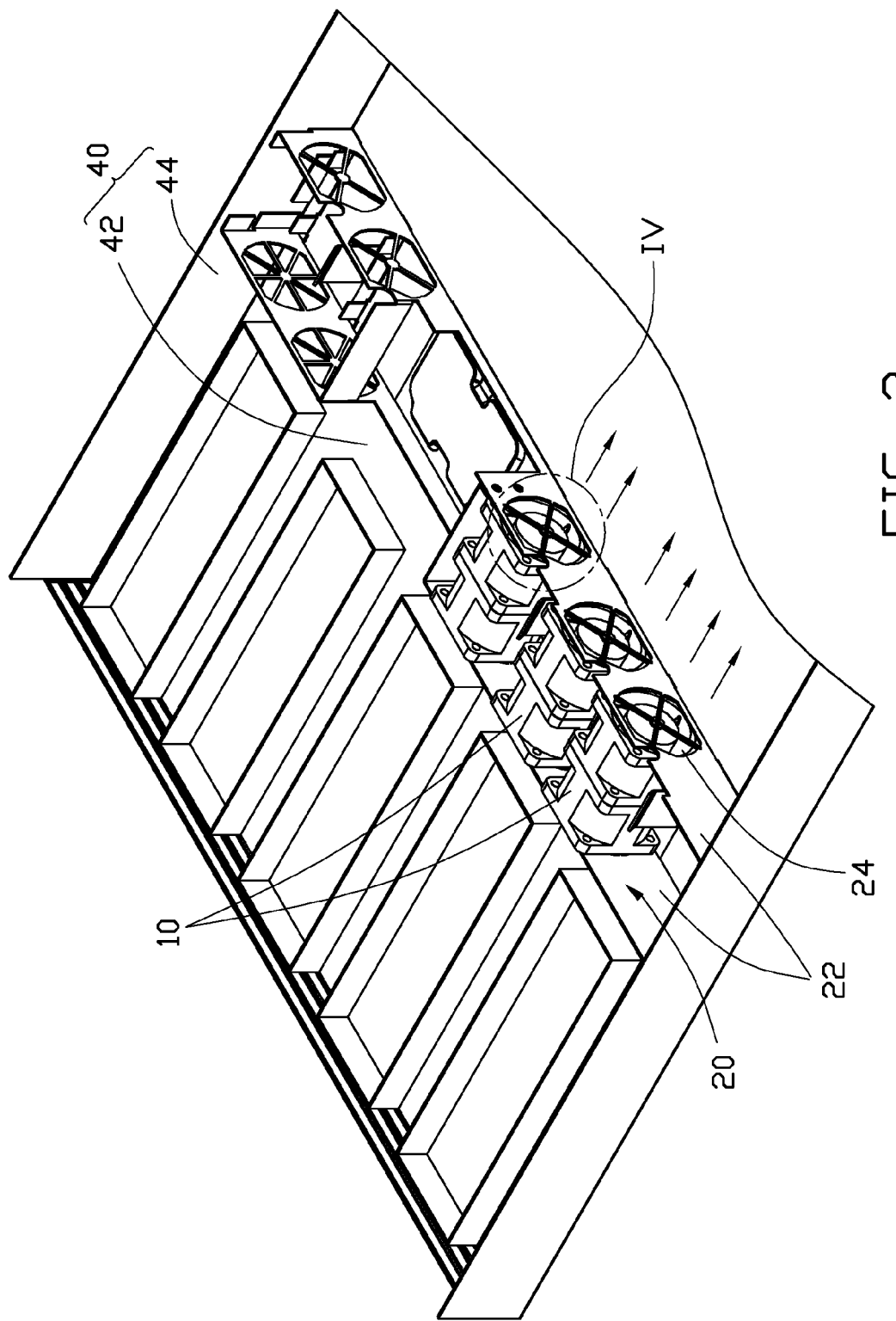
FIG. 2 is an isometric view of the electronic device in FIG. 1, with a fan duct omitted to allow for an unobstructed view.

Referring to FIGS. 1-4, a first embodiment of an electronic device includes a shell 40 and a cooling system mounted in the shell 40 to removing heat from electronic components mounted in the shell 40.

The shell 40 includes a base board 42, and two sideboards 44 extending upwardly and perpendicularly from two opposite sides of the base board 42.

The cooling system includes a plurality of fans 10, a retaining bracket 20 positioning the fans 10 onto the base board 42, and a fan duct 30 placed on the base board 42. The fans 10 are held abreast of each other on the base board 42 by the retaining bracket 20. Each fan 10 includes a fan intake, and a fan outlet opposite to the fan intake.

The fan bracket 20 includes two separated fixing plates 22 which are vertically arranged on the base board 42 and perpendicular to the two sideboards 44. A plurality of air outlets 24 is defined in a front one of the two fixing plates 22 to face the fan duct 30 and spaced from each other. A plurality of air inlets 21 is defined in a rear one of the two fixing plates 22 in alignment with the air outlets 24, respectively. The fans 10 are sandwiched between the two fixing plates 22. Two opposite ends of each fan 10 abut against two facing inner sides of the two fixing plates 22. The fan intake and outlet of each fan 10 are linked to and fully communicate with the corresponding air inlet 21 and air outlet 24 of the fixing plates 22, respectively. Each fan 10 can be a combination of multiple fan units to enhance an air pressure and current. In this embodiment, each fan 10 includes two fan units axially joined.

Figure 4:
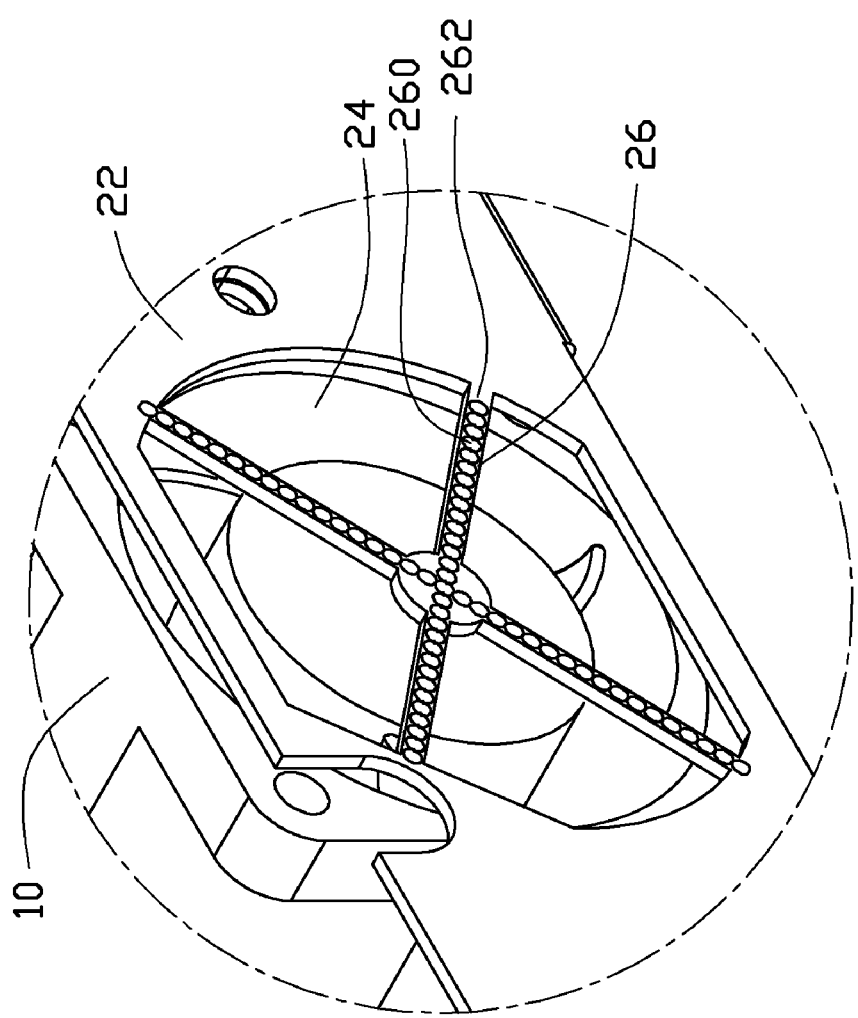
FIG. 4 is an enlarged view of a part of the electronic device in circle IV of FIG. 2.

Particularly referring to FIG. 4, a fan guard 26 is provided in each air outlet 24 of the fixing plate 22 and located in the path of airflow generated by the fan 10. A plurality of noise-reducing holes 260 is defined in the fan guard 26 for allowing a portion of the airflow from the fan 10 to exit therethrough. The fan guard 26 in each air outlet 24 includes a plural strip members 262 spanning over the corresponding air outlet 24. The noise-reducing holes 260 are evenly defined in each strip member 262 along a length of the strip member 262. The strip members 262 intersect at the center of the air outlet 24 and are centrosymmetrical relative to the center of the outlet 24. In this embodiment of the present disclosure, the fan guard 26 in each air outlet 24 includes two strip members 262.

Figure 3:
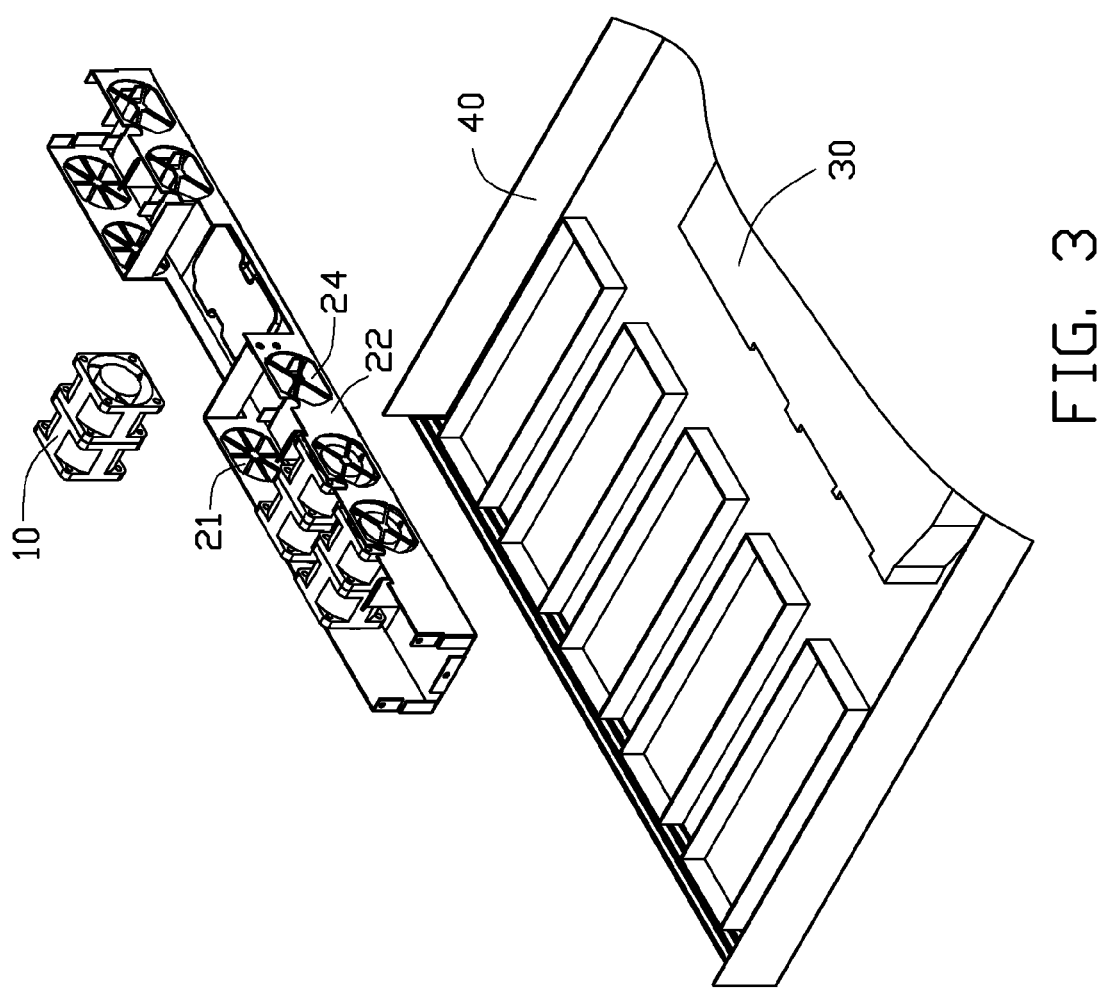
FIG. 3 is an exploded, isometric view of the electronic device in FIG. 2.
Figure 5:
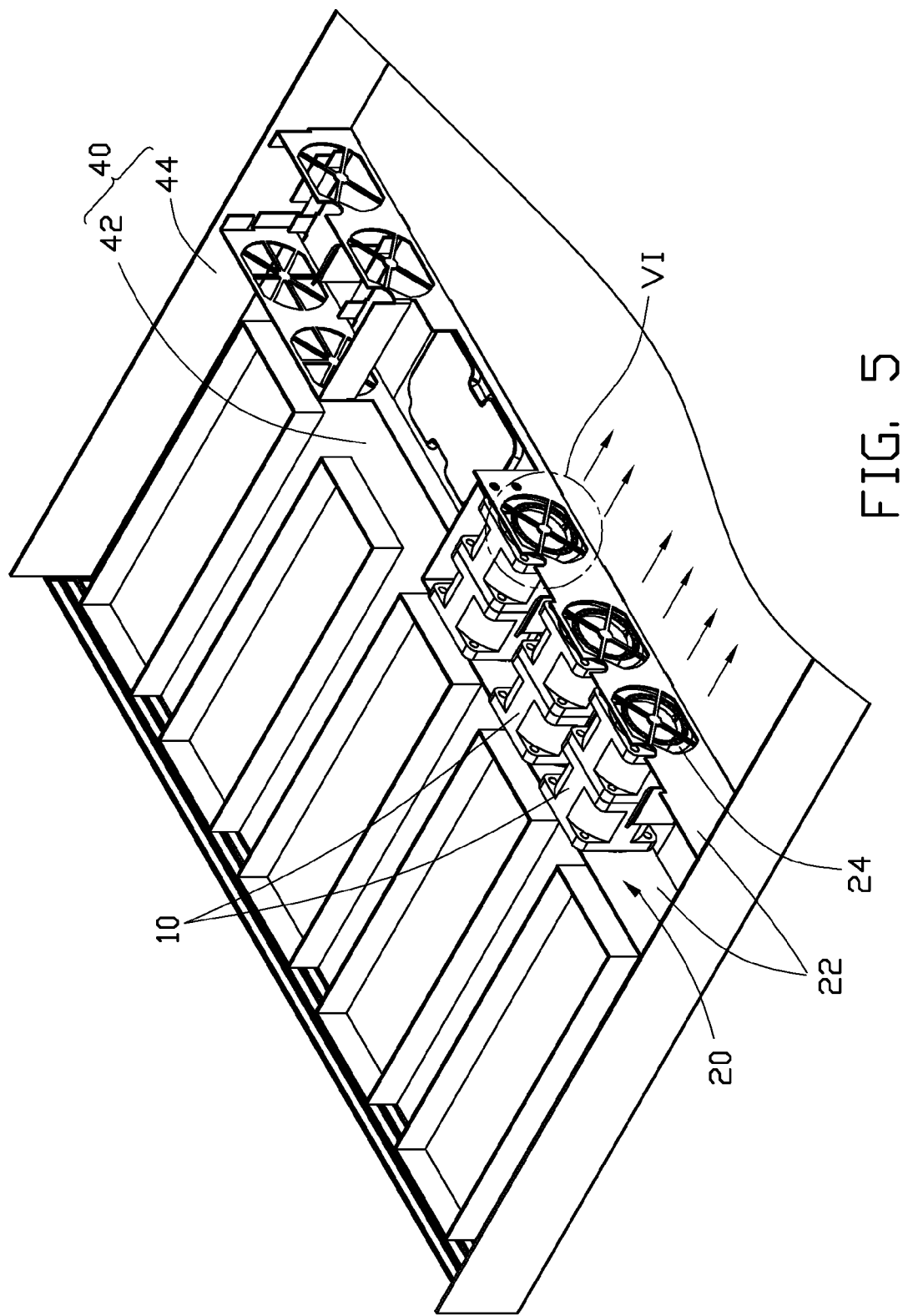
FIG. 5 is an isometric view of an electronic device in accordance with a second embodiment of the disclosure, with a fan duct omitted for allowing a better view.
Figure 6:
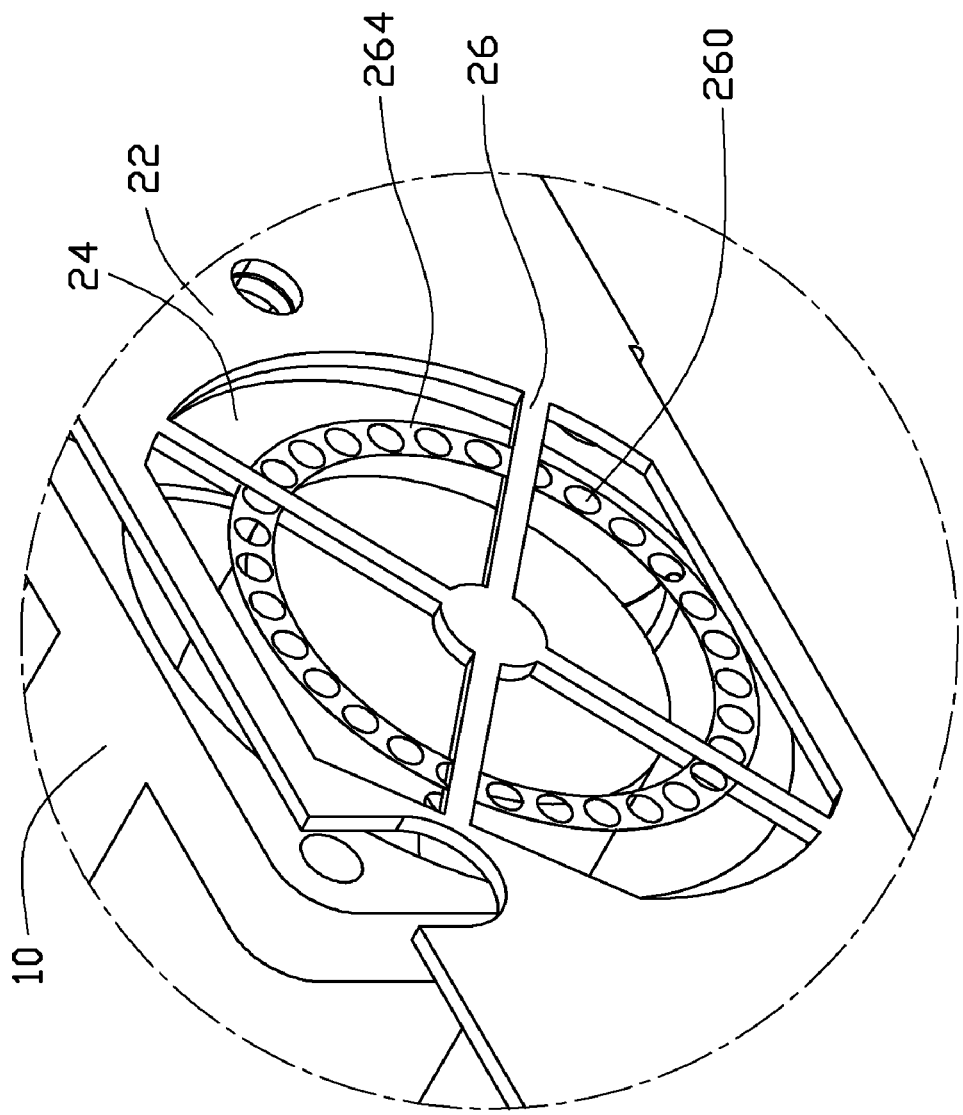
FIG. 6 is an enlarged view of a part of the electronic device in circle VI of FIG. 5.

Referring to FIGS. 5 and 6, a second embodiment of an electronic device is shown, differing from the first embodiment in FIGS. 3 and 4 by the absence of noise-reducing holes 260 in the strip members 262 but further including an annular member 264 fixed on the strip members 262 in each air outlet 24. The noise-reducing holes 260 are evenly defined in the annular members 264 which are located in the way of the airflow from the fans 10 and homocentric with the air outlets 24, respectively.

Referring to FIG. 1 again, the fan duct 30 is mounted on the base board 42 closely in a front of the retaining bracket 20 for guiding the air to help dissipate heat. The fan duct 30 comprises a plurality of side plates 32 vertically positioned on the base board 42 and a top plate 44 connected to top ends of the side plates 32 and parallel to the base board 42. An intake of the fan duct 30 is directly connected to the air outlets 24 of the retaining bracket 20.

In use, the fans 10 drive air from the air inlets 21 to the air outlets 24 of the retaining bracket 20 to flow through the electronic device. When the air flows through the air outlets 24 of the retaining bracket 20, a portion thereof exits through the noise-reducing outlets 260 perpendicular to the fixing plates 22 of the retaining bracket 20.

The fan 10 generates a pressure gradient in the electronic device, degrading from the air inlets 21 to the air outlets 24 of the retaining bracket 20. Furthermore, the change of the pressure gradient is greatest at the fan outlets of the fans 10 and the air outlets 24 of the retaining bracket 20, which is a main contributor to aerodynamic noise. Thus, the noise-reducing holes 260 exhaust a portion of the airflow at the air outlets 24 to the exterior of the fans 10 and the retaining bracket 20, reducing the change of pressure gradient at the fan outlets and the air outlets 24, and, correspondingly, reducing aerodynamic noise.

It is noted that in other embodiments, the number of fans 10 may be adjusted according to actual need. Furthermore, the number, the shape and/or arrangement of the noise-reducing holes 260 may be similarly adjusted while remaining well within the scope of the disclosure.

It has been proven in tests that the presence of the fans 10 mounted in the retaining bracket 20 with the noise-reducing holes 260 can reduce modulation strength on an average of about 9%, which greatly advances sound quality of the electronic device.

Furthermore, the usage of the noise-reducing holes 260 can reduce loudness by about 2.2 decibels and 0.03 tonality units, which further improves sound quality.

It is to be understood, however, that even though numerous characteristics and advantages of the disclosure have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A cooling system comprising:
a plurality of fans, each fan comprising a fan intake, and a fan outlet; and
a fan bracket defining a plurality of air inlets and a plurality of air outlets therein, the fan bracket provided with a fan guard in each air outlet and a plurality of noise-reducing holes defined in the fan guard;
wherein the air inlets of the fan bracket communicate with the fan intakes and the air outlets of the fan bracket communicate with the fan outlets, respectively, airflow through the fan outlets has a portion thereof exiting through the noise-reducing holes.

2. The cooling system of claim 1, wherein the fan guard in each air outlet comprises a plurality of strip members spanning over the air outlet, the noise-reducing holes being defined in the strip members.

3. The cooling system of claim 2, wherein the strip members in each air outlet intersect at the center of the air outlet and are centrosymmetrical relative to the center of the outlet.

4. The cooling system of claim 1, wherein the fan guard in each air outlet comprises a plurality of strip members spanning over the air outlet and an annular member fixed on the strip members, the noise-reducing holes being defined in the annular member.

5. The cooling system of claim 4, wherein the annular member in each air outlet is located in the way of airflow from the corresponding fan and homocentric with the air outlet.

6. The cooling system of claim 1, wherein the fan bracket comprises two fixing plates sandwiching the fans therebetween, the air inlets being defined in one fixing plate, the air outlets being defined in another fixing plate.

7. The cooling system of claim 6, further comprising a fan duct mounted on the base pale and adjacent to the fan bracket, the fan duct comprising an intake directly connected with the outlets of the fan bracket.

8. An electronic device comprising:
a base board;
a plurality of fans arranged abreast on the base board, each of the fans comprising a fan intake and a fan outlet; and
a fan bracket fixed on the base board and accommodating the fans therein, the fan bracket defining a plurality of air inlets and a plurality of air outlets therein, and being provided with a fan guard in each air outlet and a plurality of noise-reducing holes defined in the fan guard;
wherein the air inlets of the fan bracket communicate with the fan intakes and the air outlets of the fan bracket communicate with the fan outlets, respectively, airflow through the fan outlets has a portion thereof exiting through the noise-reducing holes.

9. The electronic device of claim 8, wherein the fan guard in each air outlet comprises a plurality of strip members spanning over the air outlet, the noise-reducing holes being defined in the strip members.

10. The electronic device of claim 9, wherein the strip members in each air outlet intersect at the center of the air outlet and are centrosymmetrical relative to the center of the outlet.

11. The electronic device of claim 10, wherein the fan guard further comprises an annular member fixed on the strip members, the noise-reducing holes being defined in the annular member.

12. The electronic device of claim 11, wherein the annular member in each air outlet is located in the way of airflow from the corresponding fan and homocentric with the air outlet.

13. The electronic device of claim 8, wherein the fan bracket comprises two fixing plates sandwiching the fans therebetween, the air inlets being defined in one fixing plate, the air outlets being defined in another fixing plate.

\* \* \* \* \*